US006519757B1

(12) United States Patent
Bullis et al.

(10) Patent No.: US 6,519,757 B1
(45) Date of Patent: Feb. 11, 2003

(54) HARDWARE DESIGN LANGUAGE GENERATION FOR INPUT/OUTPUT LOGIC LEVEL

(75) Inventors: Bryan Keith Bullis, Apex, NC (US); Robert Glen Gerowitz, Raleigh, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/546,982

(22) Filed: Apr. 11, 2000

(51) Int. Cl.[7] .............................................. G06F 17/50
(52) U.S. Cl. ............................................ 716/18; 716/3
(58) Field of Search ....................................... 716/1–21

(56) References Cited

U.S. PATENT DOCUMENTS

| | | | | |
|---|---|---|---|---|
| 5,146,583 A | * | 9/1992 | Matsunaka et al. ............. | 716/3 |
| 5,432,708 A | | 7/1995 | Mohsen ......................... | 716/16 |
| 5,493,507 A | | 2/1996 | Shinde et al. .................. | 703/14 |
| 5,537,580 A | | 7/1996 | Giomi et al. .................. | 716/19 |
| 5,541,849 A | * | 7/1996 | Rostoker et al. .............. | 716/18 |
| 5,544,067 A | | 8/1996 | Rostoker et al. .............. | 703/14 |
| 5,696,771 A | | 12/1997 | Beausang et al. ........... | 714/726 |
| 5,751,592 A | | 5/1998 | Takai et al. ..................... | 716/5 |
| 5,761,484 A | * | 6/1998 | Agarwal et al. .............. | 716/16 |
| 5,841,663 A | | 11/1998 | Sharma et al. ................ | 716/18 |
| 5,848,263 A | | 12/1998 | Oshikiri ......................... | 716/3 |
| 5,862,361 A | | 1/1999 | Jain ............................. | 703/16 |
| 5,867,399 A | | 2/1999 | Rostoker et al. .............. | 716/18 |
| 5,870,308 A | | 2/1999 | Dangelo et al. .............. | 716/18 |
| 5,892,682 A | | 4/1999 | Hasley et al. .................. | 716/12 |
| 5,903,475 A | | 5/1999 | Gupte et al. .................. | 703/16 |
| 6,021,266 A | * | 2/2000 | Kay ............................... | 716/2 |
| 6,058,492 A | * | 5/2000 | Sample et al. ................ | 714/33 |
| 6,152,612 A | * | 11/2000 | Liao et al. ..................... | 703/23 |
| 6,265,995 B1 | * | 7/2001 | Sahejpal et al. ............... | 341/95 |
| 6,321,366 B1 | * | 11/2001 | Tseng et al. ................... | 716/6 |
| 6,363,520 B1 | * | 3/2002 | Boubezari et al. ............ | 716/18 |
| 6,401,230 B1 | * | 6/2002 | Ahanessians et al. .......... | 716/1 |
| 6,421,808 B1 | * | 7/2002 | McGeer et al. ................ | 716/1 |
| 6,438,739 B1 | * | 8/2002 | Yamada ....................... | 716/18 |

OTHER PUBLICATIONS

Lima et al. ("Logic and high level synthesis for communication protocols", Proceedings of XII Symposium on Integrated Circuits and Systems Design, Sep. 29, 1999, pp. 142–145).*

Hwang et al. ("On the control–subroutine implementation of subprogram synthesis", Proceedings of the ASP–DAC '97 Asia and South Pacific Design Automation Conference, Jan. 28, 1997, pp. 587–592).*

Ecker et al. ("VHDL–based communication– and synchronization synthesis", Proceedings EURO–DAC '95, European Design Automation Conference, with EURO–VHDL, Sep. 18, 1995, pp. 458–462).*

Huang et al. ("ICEBERG: an embedded in–circuit emulator synthesizer for microcontrollers", Proceedings of 36th Design Automation Conference, Jun. 21, 1999, pp. 580–585).*

* cited by examiner

Primary Examiner—Matthew Smith
Assistant Examiner—Phallaka Kik
(74) Attorney, Agent, or Firm—Carl M. Wright

(57) ABSTRACT

Descriptive statements representative of a communication level coupling the functional logic of an integrated circuit to the external environment is translated into complex functional specification language for input to hardware design programs. Plain language within the functional specifications is converted to proper design language to implement hardware described by the functional specification.

2 Claims, 4 Drawing Sheets

HARDWARE DESIGN LANGUAGE GENERATION FOR INPUT/OUTPUT LOGIC LEVEL

BACKGROUND OF THE INVENTION

1. Field of the Invention

This invention relates to the design of very large scale integrated circuits. Particularly, it relates to providing data descriptive of functional specifications for instantiating circuit descriptors for hardware design programs. More particularly, it relates to the design of a new level of hierarchy for communication between an integrated circuit and its external environment.

2. Description of the Related Art

Design of VLSI (very large scale integrated) circuits typically employs a substantial number of input and output library elements. Each element typically requires two to five, sometimes more, connections for coupling signals to circuits internal to a integrated circuit chip. These include data and control signals. A VLSI circuit with 500 input/output pins may require as many as 2500 connections to connect each library book (circuit element).

Hardware design language for implementing integrated circuits requires extensive lines of code. The complications of VLSI exacerbates the problems of specifying and maintaining input to the software. One of the industry standard languages, VHDL (Very High Speed Integrated Circuit Hardware Design Language), requires a component instantiation for each of the 500 library books (technology-specific library entries, e.g., an AND gate). Such instantiations are usually entered at the top design level which tends to obfuscate the functional elements and complicates the maintenance of the design. This requires several new constructs which have to be created and maintained. Furthermore, it is sometimes desirable or necessary to comport with IEEE 1149.1 JTAG (Joint Action Test Group) connections.

BRIEF SUMMARY OF THE INVENTION

The invention provides a capability of correctly constructing the entity, every driver, every receiver, every bidirectional device, and their interconnections by creating a level of hierarchy for the input/output connections to integrated circuits. The invention is a process which transforms the language of a functional specification to generate replacement for manual entry of many thousands of lines of code, it provides the further capability of permitting changes, e.g., from a unidirectional port to bidirectional port, simply and quickly without the necessity of replacing numerous lines of code.

It simplifies the task of generating every construct necessary to automate fully the input/output inclusion in a design and eliminating the manual steps required in the prior art. An implementation of the invention generates the code for declaring component designations for each new design, defining a integrated circuit chip entity and component definition, the input/output definitions of entities, architectures, and components, signal definition for inclusion in a integrated circuit chip architecture, detection, exploding, and imploding bus design as necessary, JTAG inclusion, and connections for high impedance control during reset.

In accordance with the invention, a hardware design program converts functional specifications to hardware implementations according to functional specifications. Descriptive language statements representative of a desired hardware implementation are supplied, and descriptive language statements are transformed into functional language for input to the hardware design program. The descriptive language statements define a separate communication hierarchy level positioned between the functional hardware logic and the external environment.

BRIEF DESCRIPTION OF THE DRAWING

The invention is described in detail by referring to the various figures which illustrate specific embodiments of the invention, and wherein like numerals refer to like elements.

DETAILED DESCRIPTION OF THE INVENTION

Figure 1:
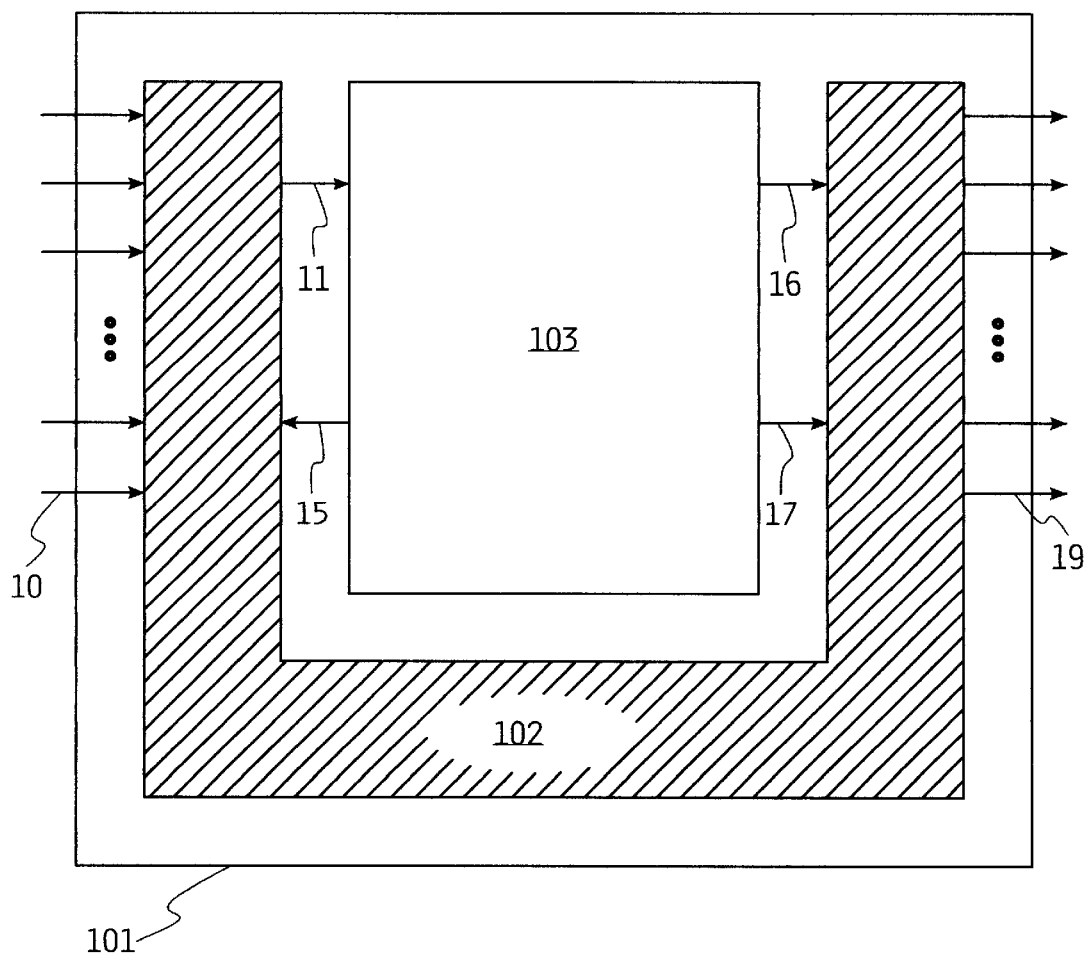
FIG. 1 is a block diagram figuratively demonstrating the location conception of a new level of an input/output logic hierarchy according to the invention.

FIG. 1 is a illustrative block representation of the use of the invention. An integrated circuit 101 contains functional logic 103 for accomplishing the integrated circuit chip's purpose. A new logic level 102 in the integrated circuit chip hierarchy according to the invention is added to perform the input/output functions to connect the external environment to the functional logic 103. The block 102 contains all the drivers, receivers, and bidirectional devices for communicating with the functional logic 103. Alternatively, the communication level can be implemented as part of any pre-existing level of hierarchy. External input lines 10 supply signals from sources external to the integrated circuit chip 101 and are controlled as necessary by control signals 15 within the integrated circuit chip 101 from the functional logic 103. Signals 19 to the environment external to the integrated circuit chip 101 are supplied via the input/output logic level 102 by conductors 16 and are controlled by control signals 17.

Figure 2:
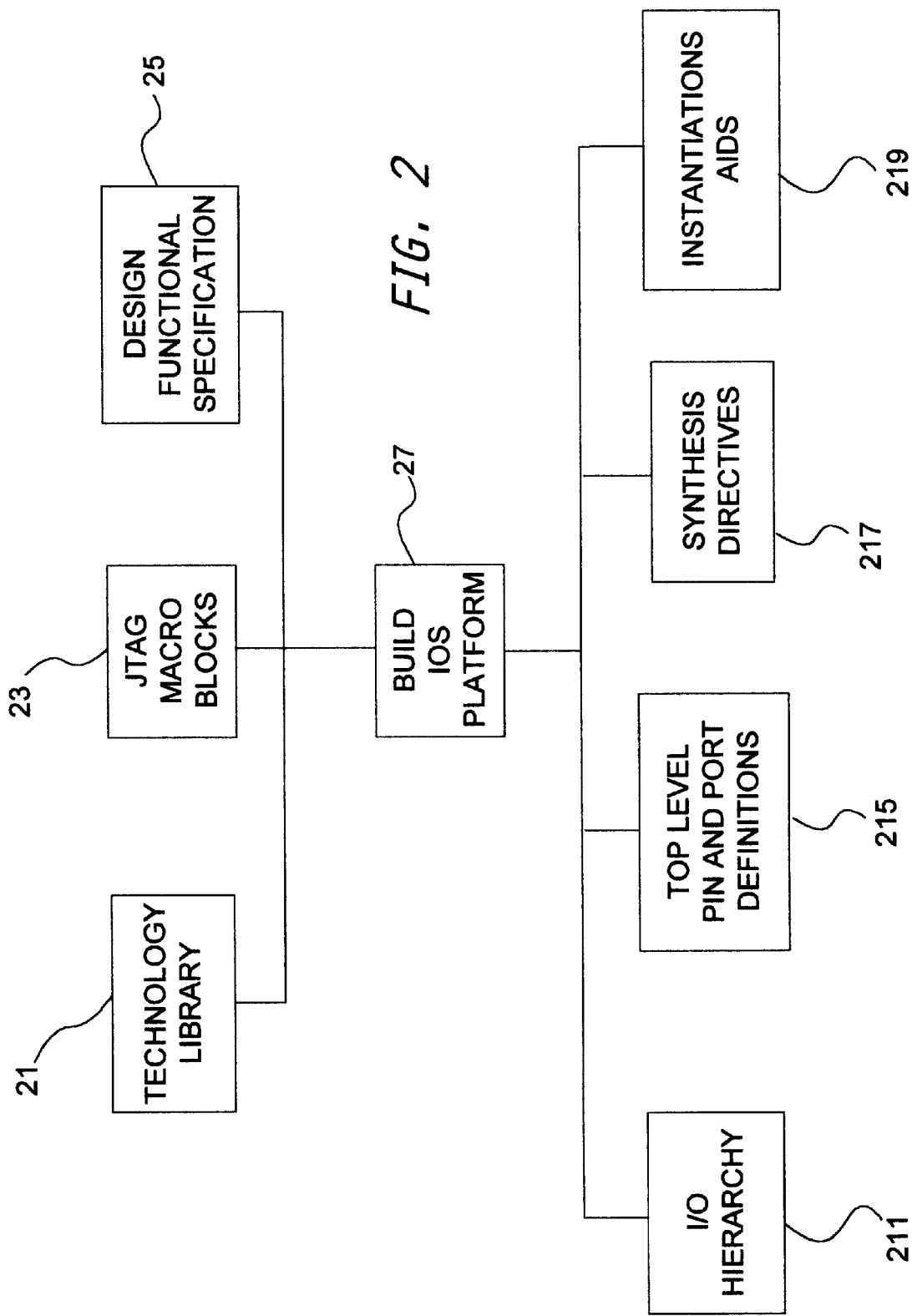
FIG. 2 is a system analysis chart showing the relation of functions employed in use of the invention.

In FIG. 2, a functional system schematic is shown. A technology library 21, supplied by a manufacturer, provides data specific to the technology implementing the integrated circuit. Another input is design functional specifications 25 describing input/output characteristic of a particular part of an integrated circuit design.

Data on several different types of macro cells are provided by JTAG macro blocks 23. These cells are required for implementation of the IEEE 1149.1 specification. Different cells are implemented depending on criteria related to their use. For example, input-only pins require one type of macro and a different type is required for an output pin.

The method of the invention is embodied in an IOS platform build 27. It takes the input data described above and transforms the short descriptive lines of input into a larger number of functionally correct design descriptions for use by the appropriate hardware design program.

One of the outputs from the IOS platform build 27 is the input/output hierarchy 211 which comprises a new level of logic hierarchy for implementing input/output (102 in FIG. 1) functions. The hierarchy 211 contains the receiver, driver, and bidirectional books (circuits from the technology library 21) and JTAG macros for communication between the functional logic of the integrated circuit chip (103 in FIG. 1) and the external environment.

The entity and component declarations for the top level of the design is represented by a block 215 (101 in FIG. 1). Synthesis directives 217 are passed to the synthesis tool of the hardware design program to annotate the design properly (such as input/output location properties).

Instantiation aids 219 are the signals necessary to incorporate the input/output hierarchy into the integrated circuit chip design. It can alternatively comprise two separate files, one being an instantiation of the input/output hierarchy and the other the wiring signals for connecting the internal of the functional logic to the input/output hierarchy. (The latter are shown in FIG. 1 as connections 11, 15, 17, and 19.) The wiring may also include any connections between the inputs and outputs to the new level of hierarchy.

Figure 3:
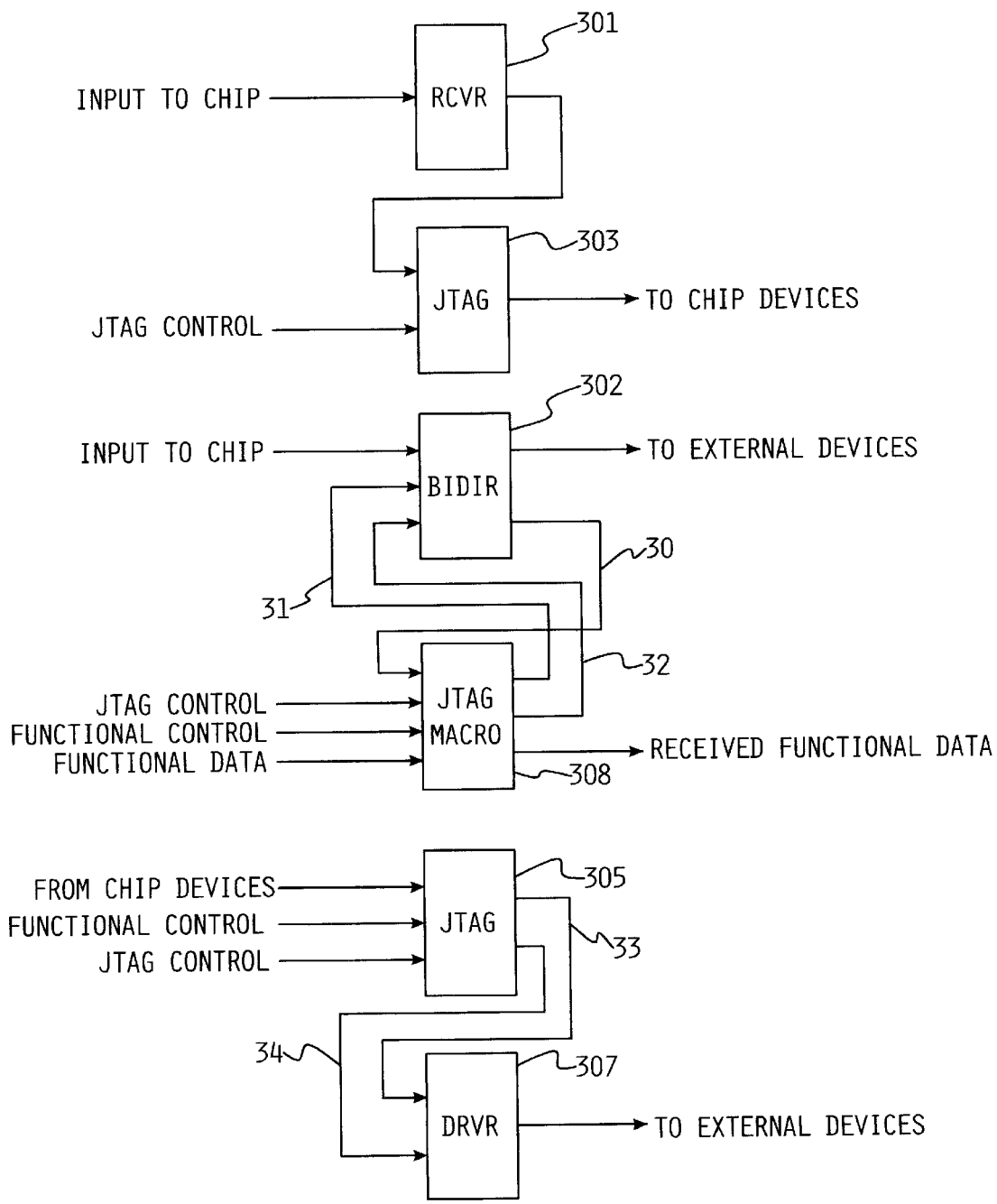
FIG. 3 is a block diagram of an interface portion of a new level of input/output logic hierarchy.

FIG. 3 shows a number of special devices contained within the new hierarchy level. All signals to and from the functional logic of the integrated circuit chip are constrained to pass through one of these special devices, which are supplied by the technology provider.

A receiver 301 is a technology-dependent library cell which receives data from the environment external to the integrated circuit chip and delivers it to the appropriate internal devices in the functional logic. A technology-dependent driver 307 receives a signal from the functional logic and sends it to an external load.

A bidirectional device 302 is also a technology-dependent cell and has the capability to receive and to transmit data to connect to the functional logic and to the external environment.

Other devices in the new logic hierarchy level can be created by the designer. For example, a JTAG device 303 controls a receive-only type of input cell such as the receiver 301 and a JTAG device 305 controls a driver-only type of output cell such as the driver 307. A JTAG macro 308 is able to control a bidirectional type of cell, sometimes referred to as a common Input/output cell. These JTAG macros control their types of devices in accordance with the IEEE 1149.1 specification, also called the Joint Test Action Group (JTAG) specification.

A connection 30 couples received data to the JTAG macro 308. A connection 32 couples drive data from the JTAG macro 308 to the bidirectional device 302. Another connection 31 couples control signals from the JTAG macro 308 to the bidirectional device 302.

Control data is coupled from the JTAG 305 to the output driver 307 by a line 33. Drive data is coupled from the JTAG 305 to the output driver by a line 34.

Figure 4:
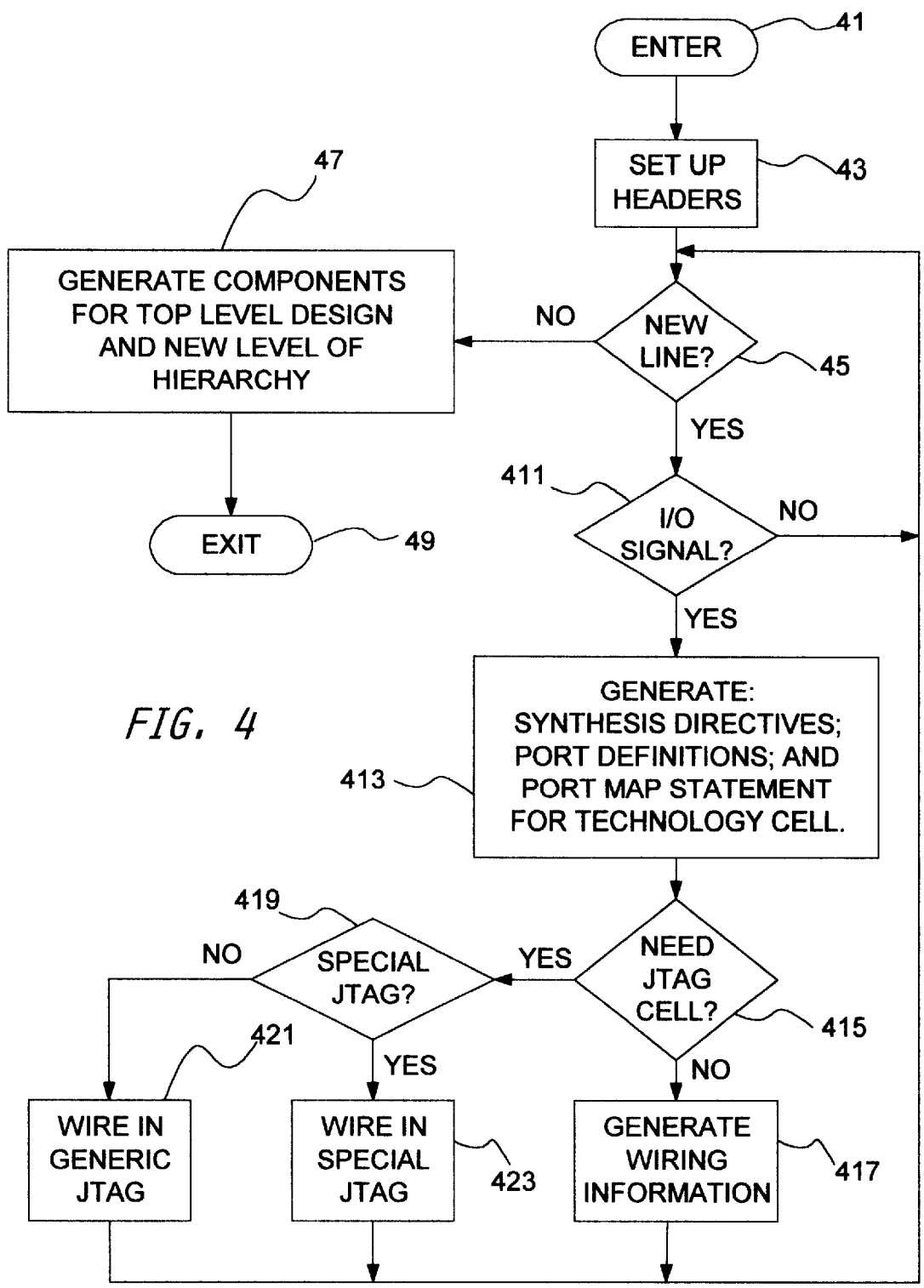
FIG. 4 is a flowchart of a procedure according to the invention.

FIG. 4 is a flowchart showing an implementation of the invention. In the following description, references are made to the flowchart depicting a sequence of operations performed by a computer program. The symbols used are standard flowchart symbols recommended by the American National Standards Institute and the International Standards Organization. In the explanation, an operation may be described as being performed by a particular block in the flowchart. This is to be interpreted as meaning that the operations referred to are performed by programming and executing a sequence of instructions that produces the result said to be performed by the described block. The actual instructions used depend upon the particular system used to implement the invention. Different processors have different instruction sets but persons of ordinary skill in the art are familiar with the instruction sets with which they work and can implement the operations set forth in the blocks of the flowchart.

The procedure is entered via a terminal block 41 and housekeeping steps, including setting up headers, are performed in a process block 43.

A decision block 45 determines whether a new line from the input is to be processed. If so, another decision block 411 checks whether the line refers to an input/output signal. If not, the sequence returns to the decision block 45 to ascertain whether there is a new line.

If the line refers to an input/output signal as determined in the decision block 411, then several lines of output specifications for the appropriate hardware design program are generated. For VHDL, this includes synthesis directives, port definitions, and a port map statement for the technology cell.

Next, a decision block 415 determines whether a JTAG cell is required. If not, then the wiring information is generated in a process block 417. If so, then a decision block 419 checks to determine whether a special JTAG is required. If not, the wiring for a generic JTAG cell is generated by a process block 421. If so, the wiring for a special JTAG cell is generated in a process block 423.

From the process block 417, the process block 421, and the process block 423, the program execution returns to the decision block 45 to check for a new line. If not a new line, then the components for the top level design and the optional new level of hierarchy are generated by a process block 47 and the procedure exits via a terminal block 49.

While the invention has been particularly shown and described with reference to a preferred embodiment thereof, it will be understood by those skilled in the art that various changes and modifications in form and details may be made therein without departing from the spirit and scope of the invention according to the following claims.

What is claimed is:

1. A process for implementing design of integrated circuits comprising the steps of:

defining functions to be executed by an integrated circuit;

supplying specifications of defined functions;

converting specifications into hardware implementations;

furnishing descriptions of a communication level to couple an external environment to the hardware implementations; and transforming the descriptions of a communication level to specifications of defined functions for input/output implementations in the communication level.

2. The process of claim 1 including the further step of:

providing standard logic specifications of elements of hardware implementations.

* * * * *